(12) United States Patent
Nayman

(10) Patent No.: US 11,345,550 B2
(45) Date of Patent: May 31, 2022

(54) CONFIGURABLE BELT CONVEYOR

(71) Applicant: Bright Machines, Inc., San Francisco, CA (US)

(72) Inventor: Arkady Nayman, Kfar Saba (IL)

(73) Assignee: Bright Machines, Inc., San Francisco, CA (US)

( * ) Notice: Subject to any disclaimer, the term of this patent is extended or adjusted under 35 U.S.C. 154(b) by 0 days.

(21) Appl. No.: 17/062,549

(22) Filed: Oct. 3, 2020

(65) Prior Publication Data

US 2021/0188562 A1 Jun. 24, 2021

(30) Foreign Application Priority Data

Dec. 22, 2019 (IL) .......................................... 271653

(51) Int. Cl.
*B65G 21/14* (2006.01)
*B65G 15/12* (2006.01)

(52) U.S. Cl.
CPC .............. *B65G 21/14* (2013.01); *B65G 15/12* (2013.01); *B65G 2201/0267* (2013.01); *B65G 2207/08* (2013.01); *B65G 2207/10* (2013.01)

(58) Field of Classification Search
CPC .............................. B65G 21/14; B65G 15/12; B65G 2201/0267; B65G 2207/08; B65G 2207/10
USPC ...................................................... 198/473.1
See application file for complete search history.

(56) References Cited

U.S. PATENT DOCUMENTS

| | | | | |
|---|---|---|---|---|
| 4,917,226 A | * | 4/1990 | Blocker | ................. B65G 15/12 198/345.1 |
| 6,199,681 B1 | | 3/2001 | Ballos | |
| 6,247,581 B1 | | 6/2001 | Oswald et al. | |
| 7,316,308 B2 | * | 1/2008 | Ullrich | ................... B65G 23/44 198/803.11 |
| 9,004,821 B2 | * | 4/2015 | Garner | ................. B65G 51/035 406/87 |
| 9,828,186 B2 | * | 11/2017 | Weickert | ............ B65G 21/2072 |
| 10,836,583 B2 | * | 11/2020 | Layne | .................... B65G 47/28 |

(Continued)

FOREIGN PATENT DOCUMENTS

| | | | | | |
|---|---|---|---|---|---|
| CN | 104828471 A | * | 8/2015 | ............. | B29C 31/08 |
| EP | 2988582 A1 | * | 2/2016 | ......... | H05K 13/0061 |
| EP | 2988582 A1 | | 2/2016 | | |

(Continued)

OTHER PUBLICATIONS

Derwent, SU 506667 A, May 1976, Derwent, Rubber Techn Machin (Year: 1976).*

(Continued)

*Primary Examiner* — Gene O Crawford
*Assistant Examiner* — Lester Rushin, III
(74) *Attorney, Agent, or Firm* — Nicholson De Vos Webster & Elliott LLP; Judith Szepesi

(57) ABSTRACT

A configurable belt conveyor for manufacturing comprising first belt and an adaptable border adjacent to the belt. The adaptable border having a first configuration in which a first width of the belt is available for supporting a pallet on the conveyor belt, and a second configuration in which a portion of the belt is covered by the adaptable border, such that the second width of the belt is sized for supporting a printed circuit board (PCB). In one embodiment, the configurable belt conveyor may be configured to form a dual stream conveyor.

20 Claims, 13 Drawing Sheets

(56) References Cited

U.S. PATENT DOCUMENTS

| | | | | |
|---|---|---|---|---|
| 10,875,718 B2 * | 12/2020 | Salomon | ............... | B65G 51/035 |
| 2013/0126301 A1 * | 5/2013 | Resca Cacciari | ...... | B65G 47/26 |
| | | | | 198/419.1 |

FOREIGN PATENT DOCUMENTS

| | | | | | |
|---|---|---|---|---|---|
| SU | | 506667 A | * | 5/1976 | ............... D06C 3/06 |
| WO | WO-2014170993 A1 | * | 10/2014 | ......... H05K 13/0061 |

OTHER PUBLICATIONS

International Search Report and Written Opinion, PCT App. No. PCT/US2020/070946, dated Mar. 26, 2021, 13 pages.

* cited by examiner

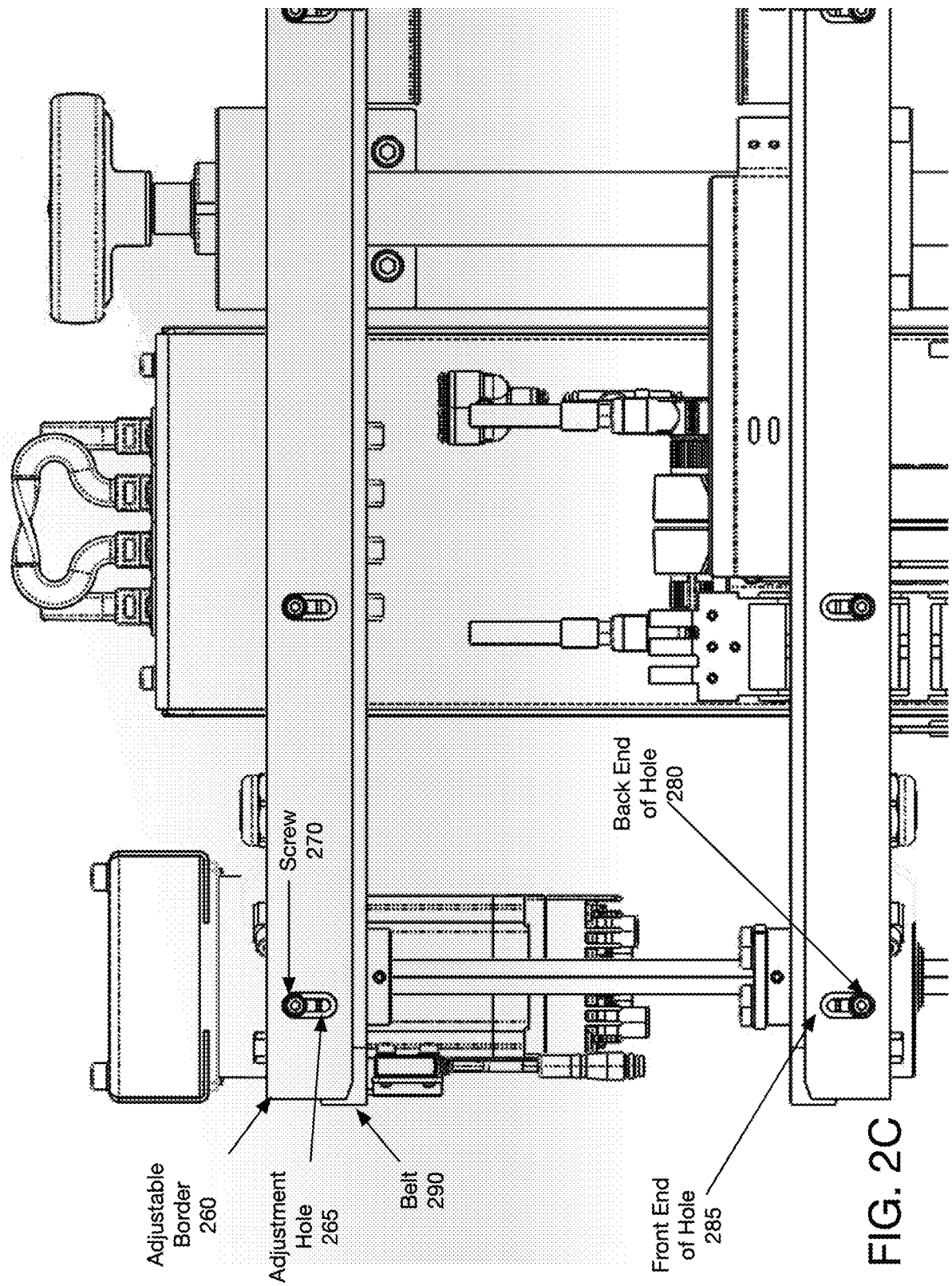

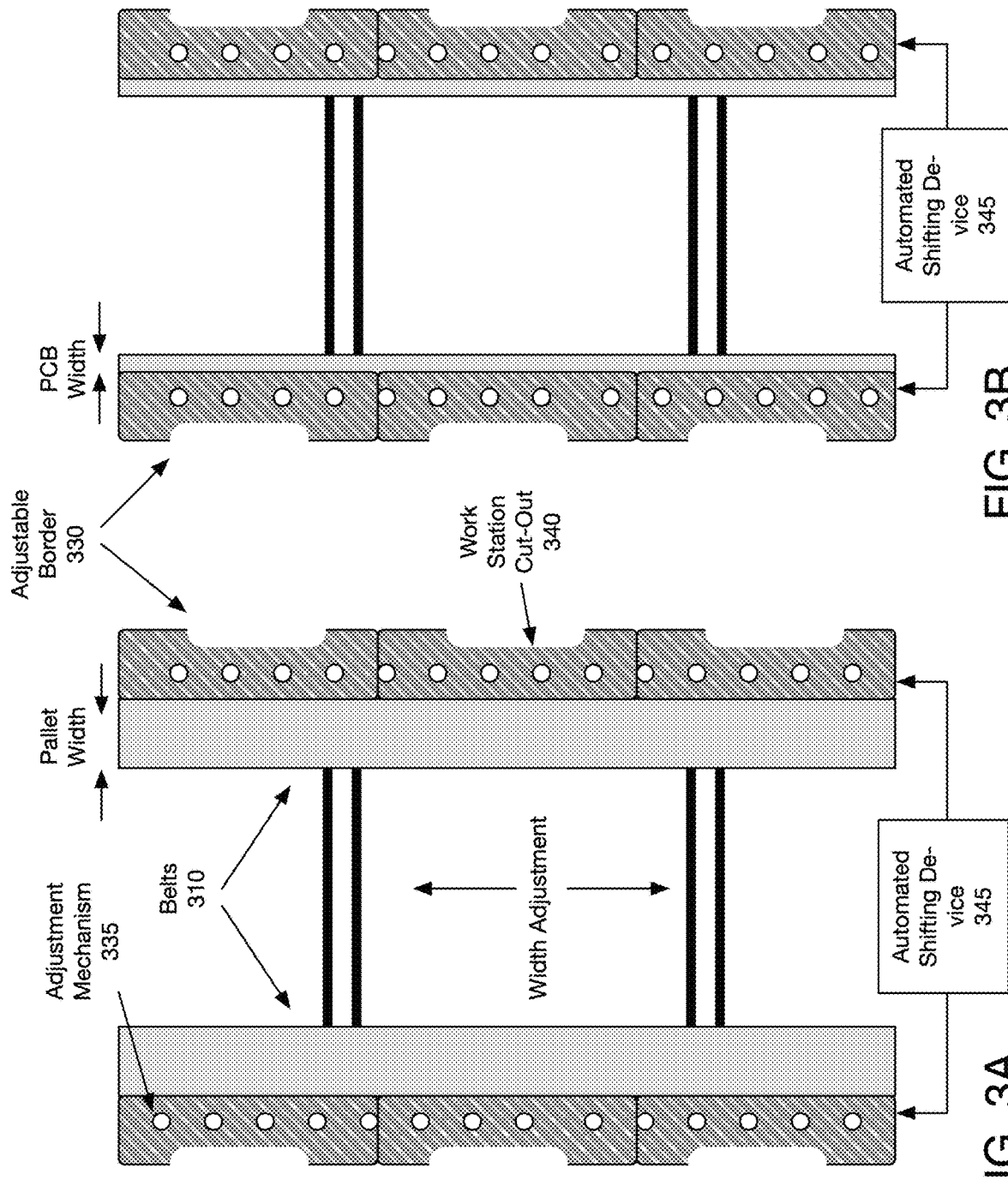

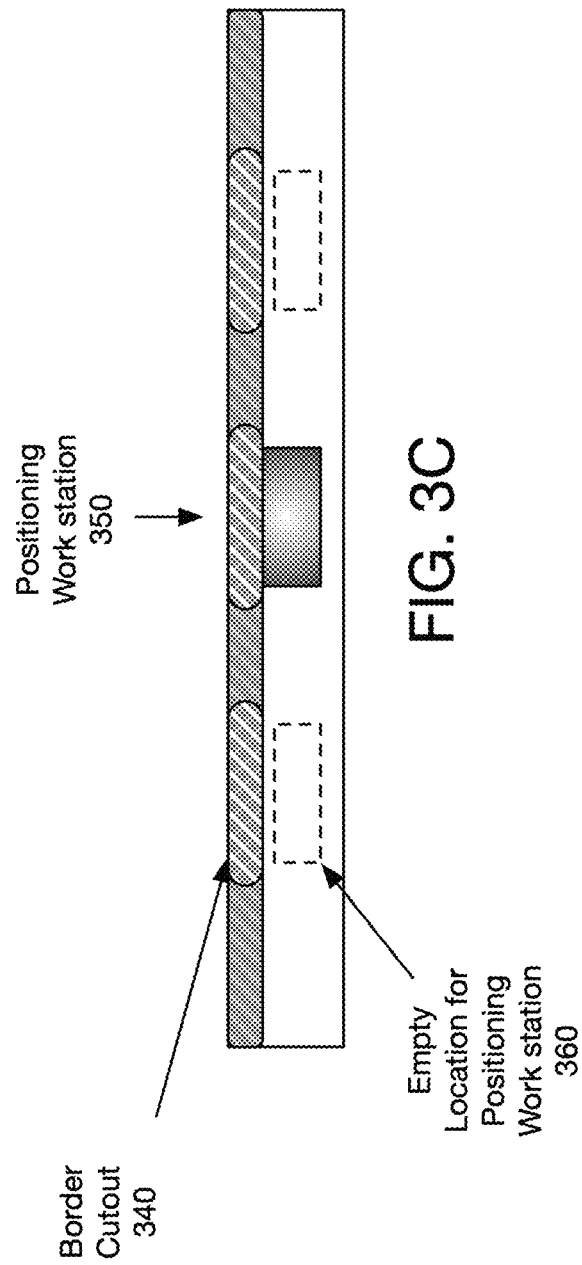
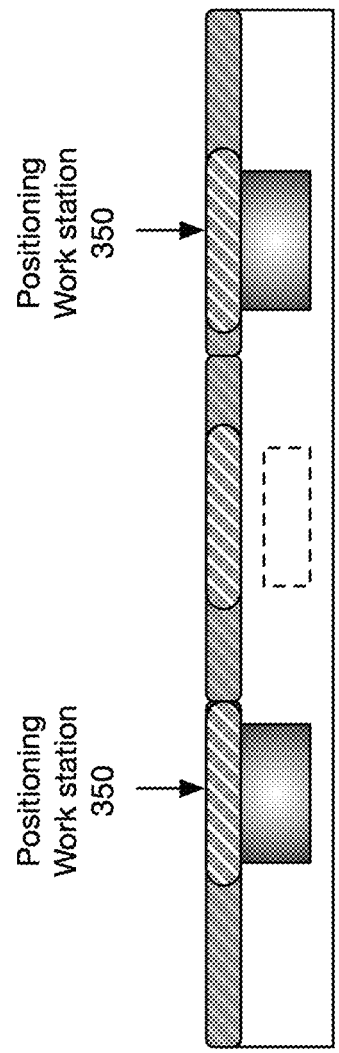

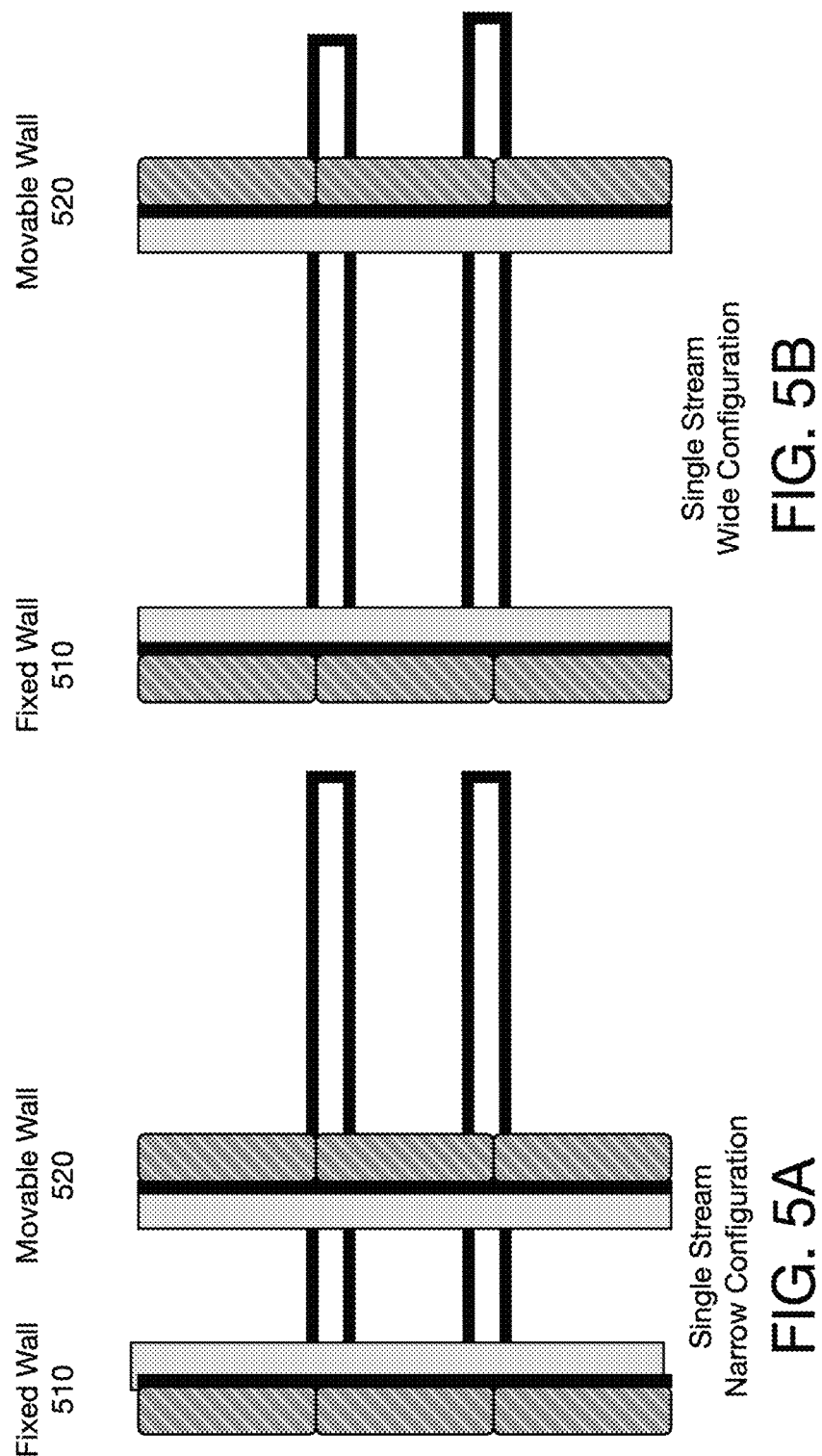

Dual Stream
Wide Configuration

Dual Stream
Narrow Configuration

CONFIGURABLE BELT CONVEYOR

RELATED APPLICATION

The present application claims priority to Israeli Patent Application No. 271653, filed on Dec. 22, 2019, and is incorporated herein by reference in its entirety.

FIELD

The present invention relates to conveyor belts, and more specifically to a configurable belt conveyor.

BACKGROUND

In manufacturing environments, there is often a belt conveyor which conveys parts to a work station. In electronics and other manufacturing industries there may be two groups of conveyors, for example, one group for pallets and a separate group for printed circuit boards.

Pallet conveyors must be able to support the heavy weight of a loaded pallet, while printed circuit board conveyors must provide precision placement, because most printed circuit boards (PCB) have a very small area which does not have circuit components on it, and thus can be safely used to support the PCB. In order to comply with IPC SMEMA Council's IPC-9851 "Mechanical Equipment Interface Standard," such conveyors must have 0.2 inch (5 mm) shoulders for conveying PCBs, to ensure that the conveyor does not interfere with any of the electronics on the PCB.

BRIEF DESCRIPTION OF THE FIGURES

The present invention is illustrated by way of example, and not by way of limitation, in the figures of the accompanying drawings and in which like reference numerals refer to similar elements and in which:

FIG. 2C is a zoomed-in top view of the configurable belt conveyor, set for PCBs.

FIGS. 3A and 3B are simplified diagrams of one embodiment of the belt conveyor showing the adjustability of the adjustable borders.

FIGS. 3C and 3D are simplified diagrams of one embodiment of the belt conveyor showing two alternate configurations for work stations along the belt conveyor.

FIGS. 5A-5D are simplified diagrams of one embodiment of the belt conveyor showing the width adjustability, and the multi-stream adjustability.

DETAILED DESCRIPTION

Figure 1A:
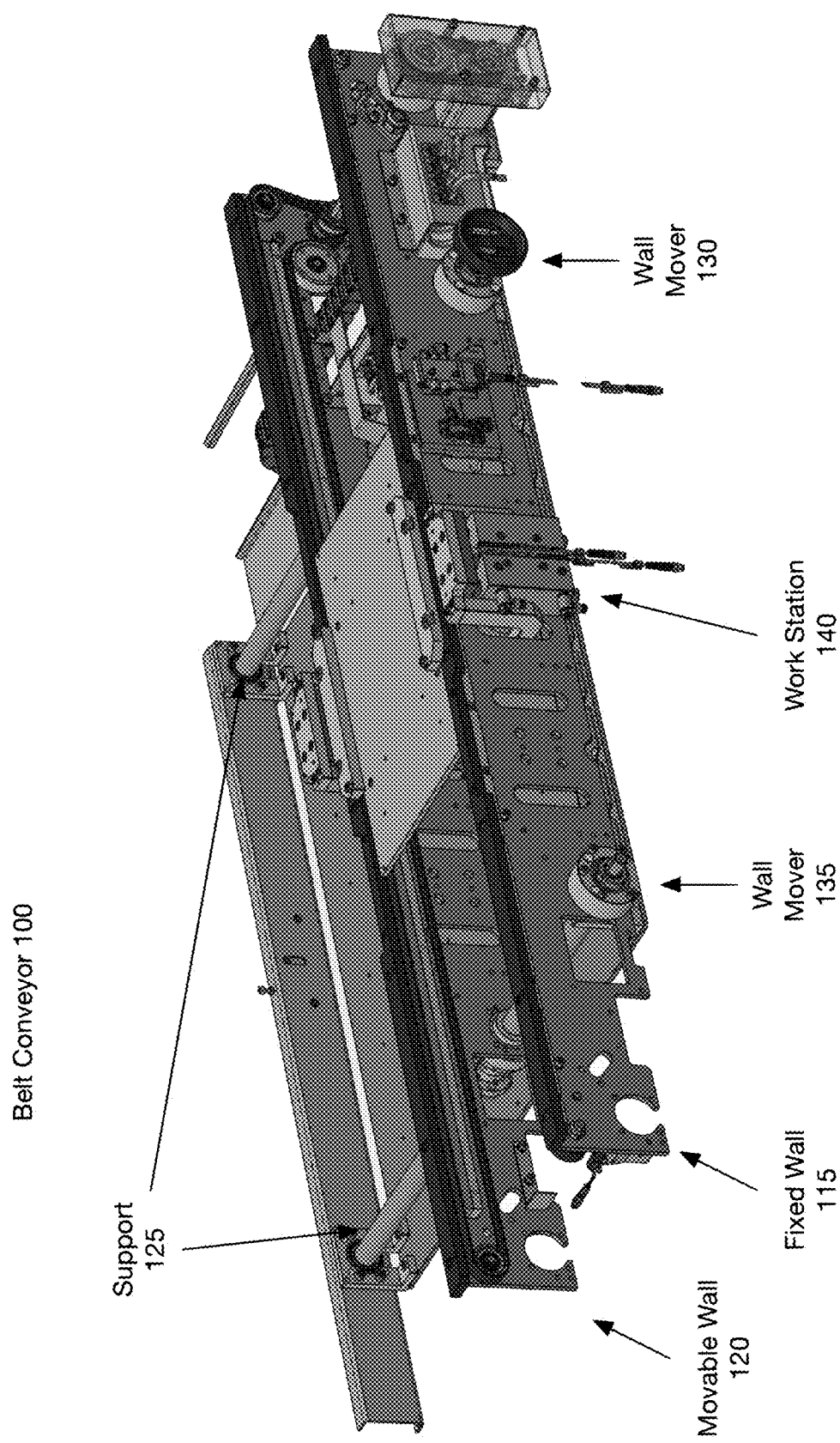
FIG. 1A is a perspective view of one embodiment of the configurable belt conveyor, configured for one stream.

In a manufacturing line, typically each assembly station has some conveying device to receive in, lock down, and send out, products that the station is working on. In the prior art, there were separate conveyor belts for different types of workpieces, for example rigid pallets and PCBs, because they have different requirements. The configurable belt conveyor described can be reconfigured in various ways, to provide a single or dual conveyor that is capable of being configured to handle different types of workpieces, for example pallets or PCBs. Pallets require a conveyor that provides a sufficiently large support area to support the weight of the pallets. PCBs require a narrow support area to ensure that the belts do not overlap with electronics on the PCB. Furthermore, it is useful to have a clear space between the belts conveying PCBs, because PCBs may have electronic components on both sides, or elements near the edge.

A belt conveyor includes a paired set of belts, which typically move in unison. In one embodiment, the belts are self-tracking timing belts, which eliminates the need to guide the belt from inside the belt conveyor area and provides full utilization of the exposed belt area for PCBs. In one embodiment, the self-tracking timing belt used has a guiding profile on the back side. In one embodiment, other types of self-guided belts may be used, which remove the need for separate guidance elements inside the conveyor area.

For a pallet conveyor, the belt is generally 15 mm or wider, to provide enough support area for the heavier pallet. For a PCB conveyor, the belt is required by standard to be 5 mm or thinner, to ensure that the conveyor belt does not damage any of the elements attached to the PCB. The configurable belt conveyor uses a belt that is wide enough or wider than needed for all use cases, and an adjustable system that occludes a variable portion of the belt width so that the belt exposes the proper width for a given task. In this way, a conveyor belt can function with any number of smaller belt widths. The configurable belt conveyor described can be reconfigured to narrow the exposed area of the belt, for example from a pallet configuration to a PCB configuration, and vice versa.

In one embodiment, the configurable belt conveyor includes an adaptable border, which provides the edge and narrows the exposed area of the belt for use with PCBs, to adjust the belt width. In one embodiment, the adjusted belt width complies with the standard for PCBs, which in one embodiment is 5 mm. The narrowing also ensures that the PCB cannot shift its orientation or position on the conveyor belt. In one embodiment, the adaptable border is attached via screws, and moved manually. In one embodiment, the adaptable border may be moved automatically. In one embodiment, the adaptable border may be attached in another way. The purpose of the adaptable border is to cover a portion of the belt, resulting in a functional belt that is wide enough to support pallets or other items to be conveyed but can be narrowed to comply with the standard-defined width for supporting PCBs, or other standards that utilize a narrower belt configuration.

In one embodiment, the configurable belt conveyor also has a plurality of work stations, at which a pallet or PCB may be fixed into place. In one embodiment, the configurable belt conveyor may include multiple positions where such work stations may be placed, such that a belt conveyor segment may be configured for one or more work stations. In one embodiment, a belt conveyor segment may include a single work station, or two work stations. The work stations, in one embodiment, include clamps located beneath the pallets to fix the pallet in place while they are in use.

In one embodiment, the configurable belt conveyor may be configured to be a single stream conveyor or a dual stream conveyor. In one embodiment, for the dual stream configuration, there are two fixed walls, and two adjustable walls, one for each stream.

Thus, the configurable belt conveyor system is designed to be adjustable to provide the right kind of conveyor for any workpiece.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized, and that logical, mechanical, electrical, functional and other changes may be made without departing from the scope of the present invention. The following detailed description is, therefore, not to be taken in a limiting sense, and the scope of the present invention is defined only by the appended claims.

FIG. 1A is a perspective view of one embodiment of the configurable belt conveyor, configured for one stream. The belt conveyor 100 includes two belts which move in unison. The belt conveyor shown has one fixed wall 115 and one movable wall 120. The supports 125 along which the movable wall 120 is moved (to narrow or widen the distance between the belts) can be seen. In one embodiment, the movable wall 120 is moved using a manual wall mover 130. In one embodiment, the movable wall 120 is moved using motor-driven mover 135. In this configuration, a single work station 140 is shown. The work station 140 is a position at which a pallet (or PCB) may be fixed while it is active or in use. In this configuration, the system enables the use of a single pallet (or PCB).

Figure 1B:
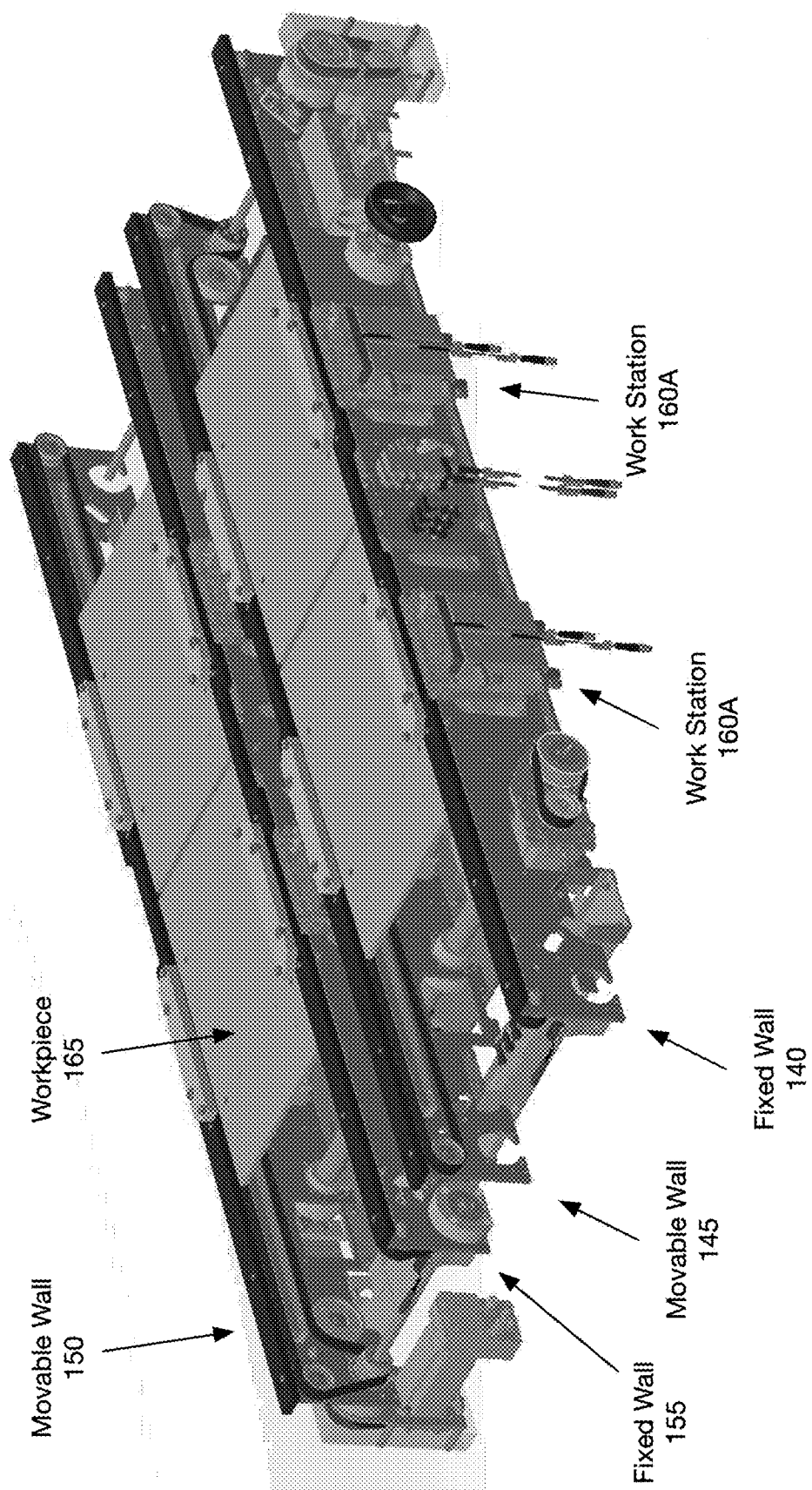
FIG. 1B is a perspective view of one embodiment of the configurable belt conveyor, configured for dual streams.

FIG. 1B is a perspective view of one embodiment of the configurable belt conveyor, configured for dual streams. As can be seen, there are two fixed walls 140, 155, and two movable walls 145, 150. Additionally, in the configuration shown, there are two work stations 160A, 160B for each of the two streams, enabling a total of four workpieces 165 (here pallets) to be actively utilized in this configuration.

Note that while the illustrations show a double stream configuration with two work stations 160, and a single steam configuration with a single work station, the configurations may be mixed and matched. Thus, the present configurable belt conveyor may have between one and four active pallets (or PCBs) at any one time, in one embodiment.

Figure 2A:
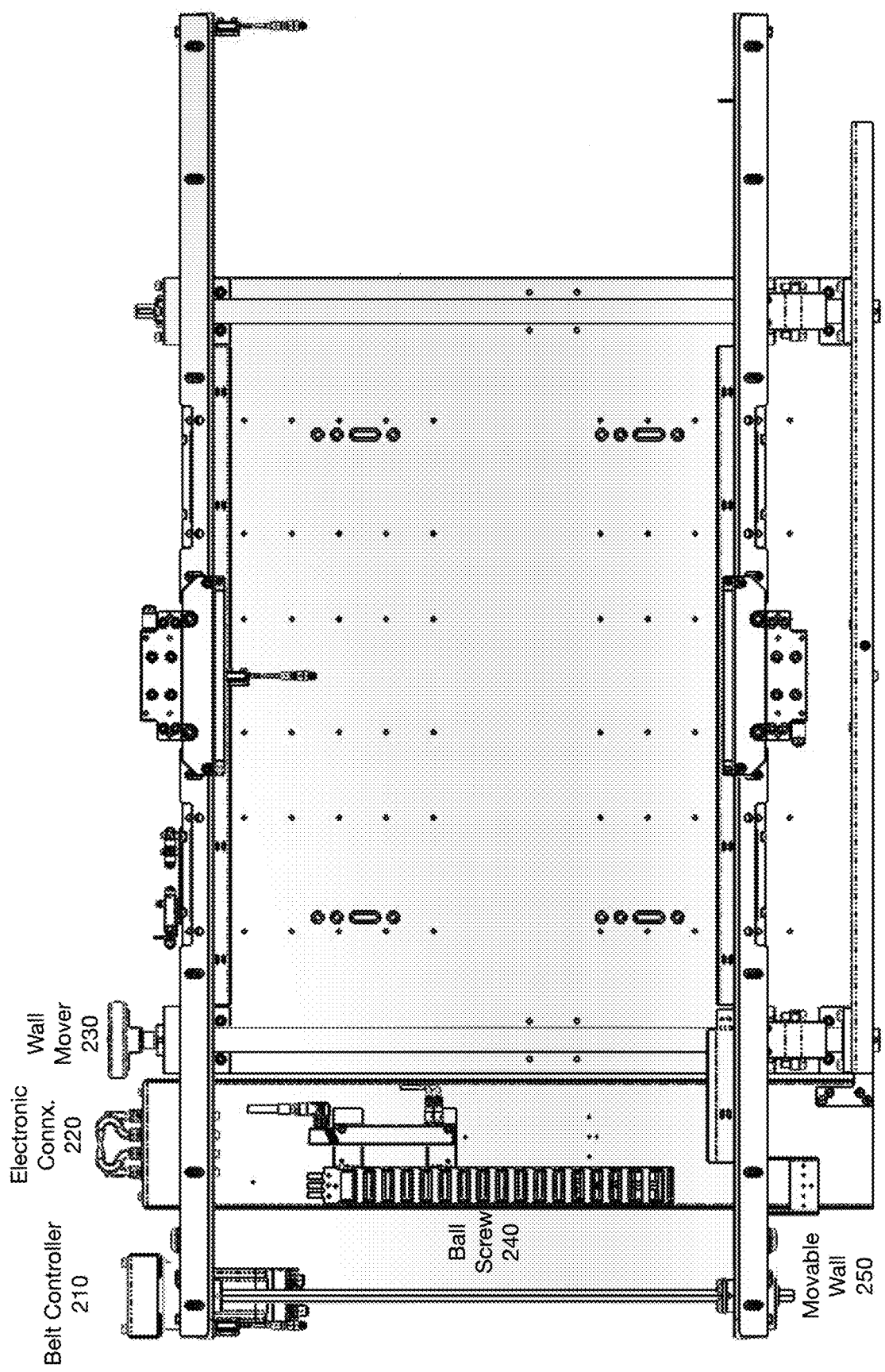
FIG. 2A is a top view of one embodiment of the configurable belt conveyor configured for one stream.

FIG. 2A is a top view of one embodiment of the configurable belt conveyor configured for one stream. In addition to the elements described above, this illustration shows the conveyor belt controller 210 which controls the movement of the conveyor belts. In one embodiment, the electronic connection 220 couples the control systems to the belt conveyor. In one embodiment, conventional control systems are used, and the particular controls used are not limited. The present system may be used with any conveyor belt system which can accept the adjustable border elements that provide the configurability described.

In one embodiment, the wall mover 230 is used to rotate the ball screws, that translate the rotational motion of the wall mover 230 (or motor) to the linear movement for moving the movable wall 250. While only one ball screw 240 is visible, in one embodiment, the system uses two ball screws to ensure that the movable wall is supported, which are both controlled by wall mover 230. In one embodiment, the system does not include additional guides, and the ball screws 240 provide the movement and the support for the movable wall 250.

Figure 2B:
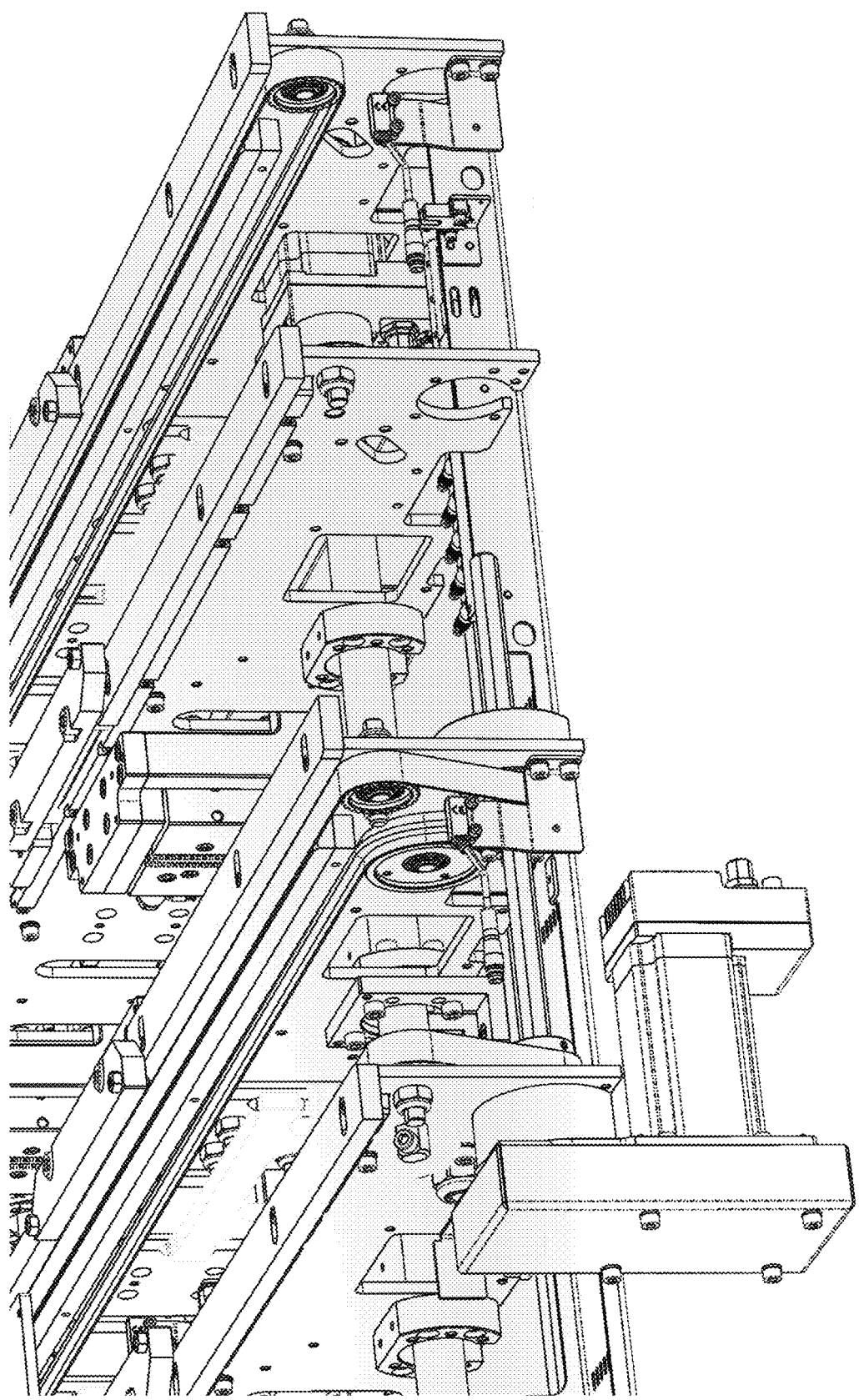
FIG. 2B is a zoomed-in perspective view of the configurable belt conveyor, configured for dual streams.

FIG. 2B is a zoomed-in perspective view of the configurable belt conveyor, configured for dual streams, and configured for a narrow conveyor. The width of the conveyors is adjusted based on the size of the workpieces carried by the belt conveyor. The sizes of the items carried by the conveyor belt are varied, and the width of the conveyor belt is adjusted to accommodate those variations.

FIG. 2C is a zoomed-in top view of the configurable belt conveyor, set for PCBs. This shows the adjustable border 260, in its forward setting, showing only a small portion of the belt 290. In one embodiment, the position of the adjustable border 260 is controlled by adjustment holes 260, which are ovoid, and provide multiple settings. In one embodiment the settings include a PCB setting in which the screw 270 is at the back end 280 of the ovoid hole 265, and a pallet setting in which the screw 270 is at the front end 285 of the ovoid hole 265. Other belt width settings may also be used. In one embodiment, the adjustable border 260 is made of ultra-high-molecular-weight polyethylene. In another embodiment, another material is used. In one embodiment, the material is a low friction, anti-static material.

Figure 2D:
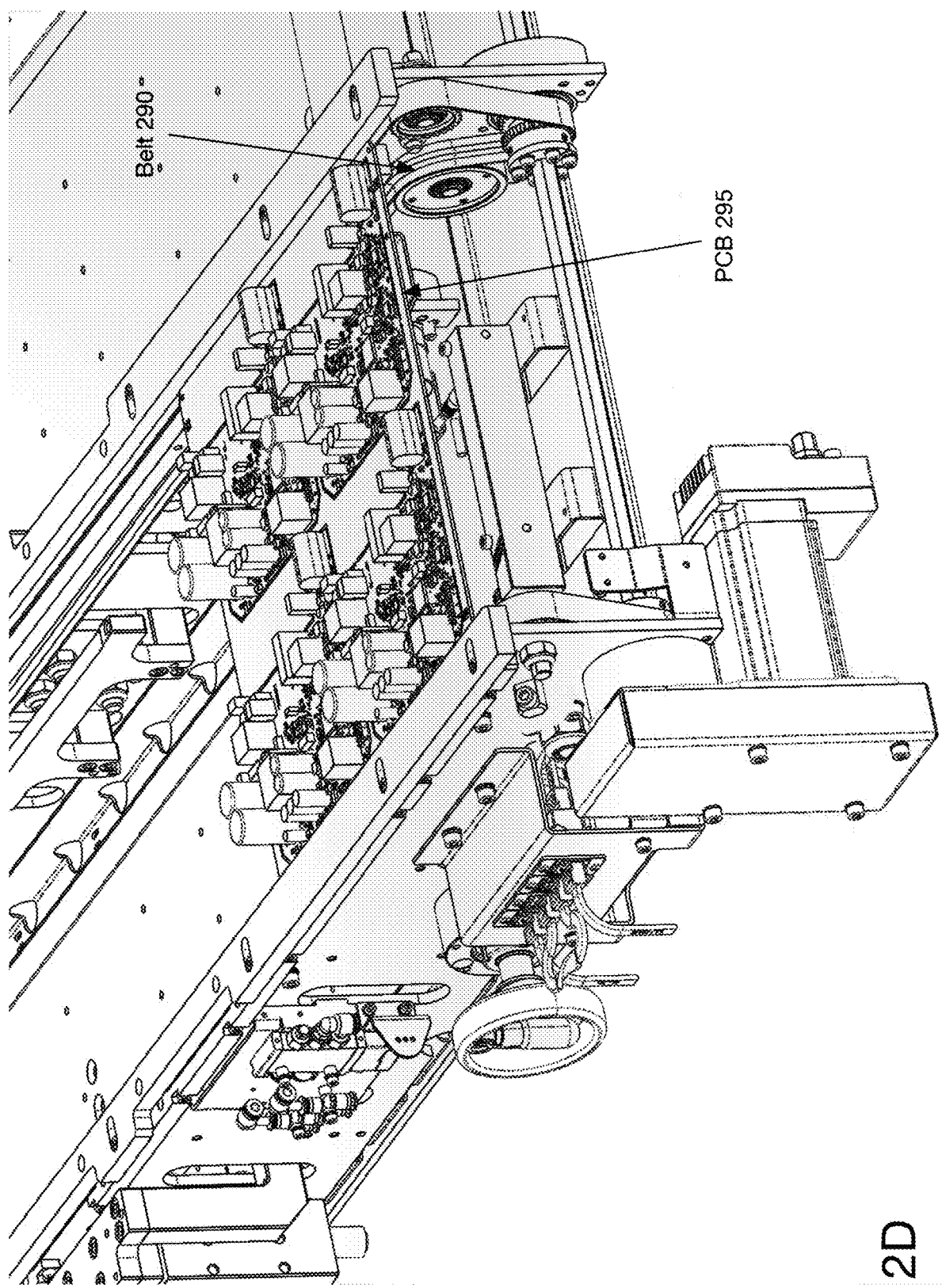
FIG. 2D is a zoomed-in perspective view of the configurable belt conveyor, set for PCBs, showing an exemplary PCB.

FIG. 2D is a zoomed-in perspective view of the configurable belt conveyor, set for PCBs, showing an exemplary PCB. As can be seen, the belt is sufficiently narrow to provide support only on the edge of the PCB 295. As can be seen, the edges of the adjustable border 265 abut the PCB and provide stable support for the PCB 295. The belt 290, in one embodiment is a self-tracking timing belt. In one embodiment, the self-tracking timing belt has a guiding profile. This feature leaves all the internal area between the belts' internal edges clear for the PCB, as can be seen. Other types of self-guided belts may be used. In some embodiments a standard belt with an alignment elements in the central area may be used.

Figure 2E:
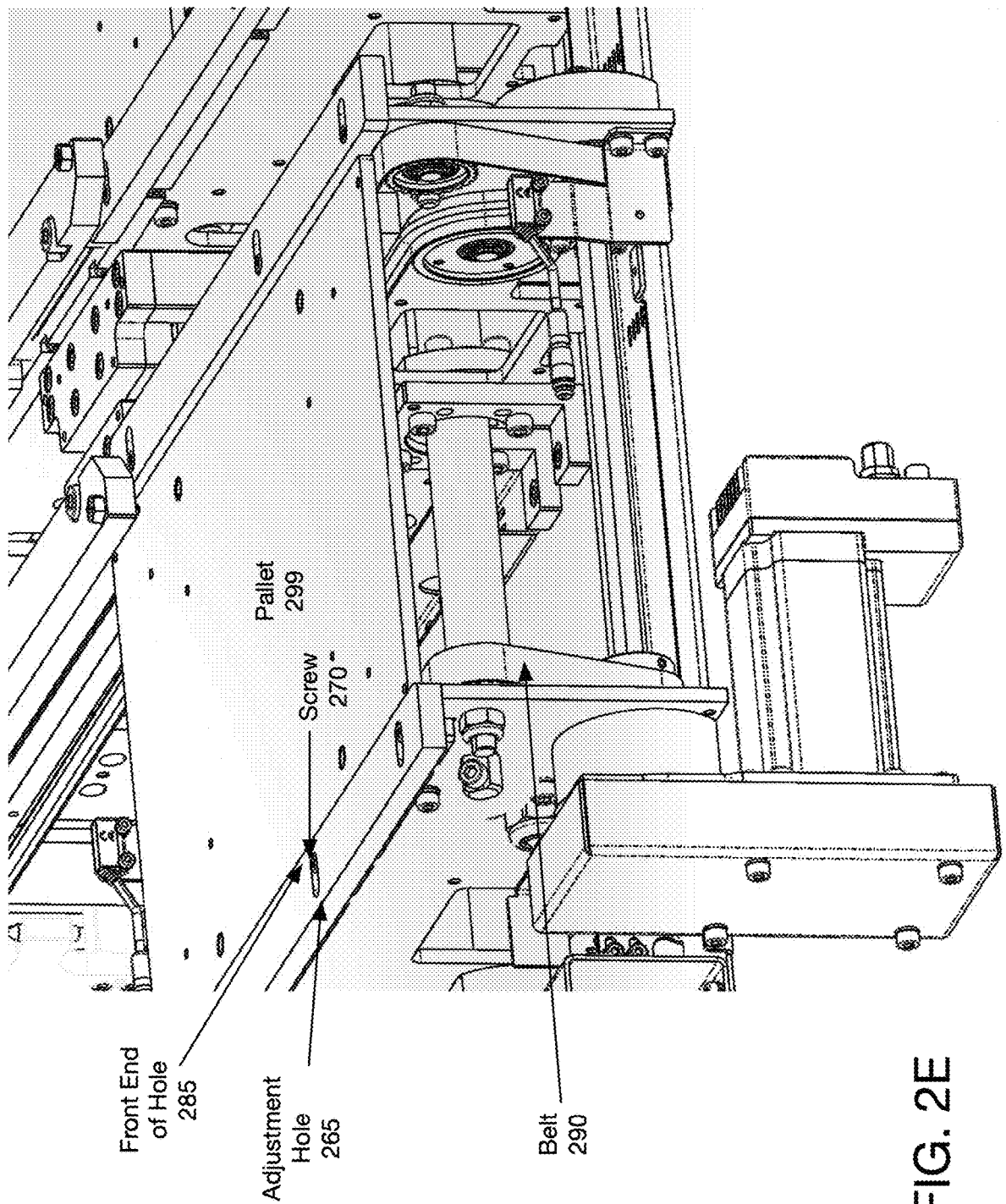
FIG. 2E is a zoomed-in perspective view of the configurable belt conveyor, set for pallets, showing an exemplary pallet (empty).

FIG. 2E is a zoomed-in perspective view of the configurable belt conveyor, set for pallets, showing an exemplary pallet (empty). As can be seen, the adjustable border is in the rear setting, where the screws are at the front end of the adjustment holes 265. This provides a wide enough belt 290 to support the heavier pallet 299.

FIGS. 3A and 3B are simplified diagrams of the conveyor belt showing the adjustability of the adjustable borders. The belts 310 are either not covered, or partially covered by adjustable border 330. The adjustable border 330 has two positions, in one embodiment, forward covering the belt, or rearward, where the belt is uncovered. In another embodiment, the adjustable border 330 may have any number of positions. In one embodiment, the rearward setting, shown in FIG. 3A, a small percentage of the belt 310 may remain covered. In another embodiment, in the rearward setting, the belt is not overlapped by the border 330.

Adjustment mechanism 335 enables the adjustment of the adjustable border 330 between the forward and rearward settings. In one embodiment, adjustment mechanism 335 includes oval screw holes, and screws. Some other exemplary adjustment mechanisms 335 are illustrated in FIG. 3E below. However, the specific adjustment mechanism is not limited by the examples provided. In one embodiment, the system includes an automated shifting device 345 to shift the adaptable border automatically between configurations.

In one embodiment, the adjustable border 330 has work station cut-outs 340, which enable the work station to engage with the pallet and/or PCB, to fix the workpiece in place when it is in use. This enables the workpiece to be raised to clamp the workpiece in place, regardless of the position of the border 330. The use of such clamping mechanisms is known in the art.

FIGS. 3C and 3D are simplified diagrams of the conveyor belt showing the adjustability of the positioning work stations 350. As noted above, in one embodiment, the configurable belt conveyor includes three potential locations for work stations 350, 360. In one embodiment, the work stations are pneumatic-activated clamping systems which lift a pallet a few millimeters from the conveyor belt and stick them into the plates that are mounted on the work station. In one embodiment, the work stations are used to clamp PCBs to the belt. In one embodiment, for larger PCBs, the work stations may include an additional support element within the conveyor to provide center-rigidity to the PCB.

In the example shown in FIG. 3C, the central work station is occupied, and the other two work stations locations are empty. In the example shown in FIG. 3D, the two side work stations are used, and the center work station is empty. In one embodiment, the work stations 350 may all be occupied, with only one or two active work stations. In another embodiment, the work stations 350 may be present in only those positions in which they are used. Note that while the example shows a belt conveyor with three possible work stations, one of skill in the art would understand that the system may include fewer or more than three work stations.

Figure 4:
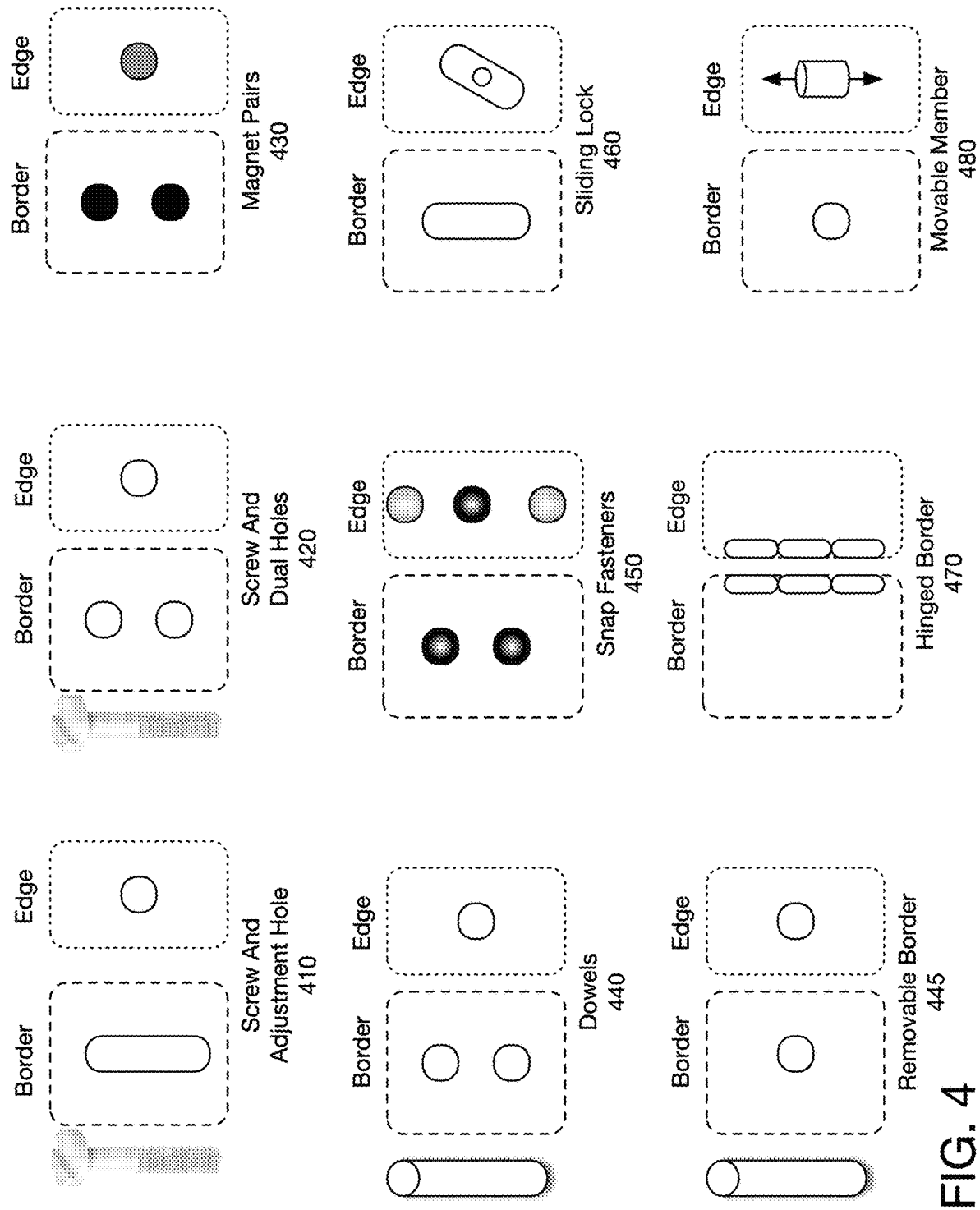
FIG. 4 illustrates some exemplary adjustment mechanisms.

FIG. 4 illustrates various exemplary attachment mechanisms that may be used with for the adjustable border. In one embodiment, there may be various manual adjustment mechanisms, in which the border adjustment is made manually. In one embodiment, there may be various automatic adjustment mechanisms in which the system automatically shifts the position of the adjustable border, using mechanical or electronic controls. The adjustable border movement may include linear shifting and/or rotary (tilting, swinging, and/or rotating) movement between the two (or more) positions. The adjustable border may alternatively be removable, such that the border is placed onto the conveyor only while the system is configured for narrower configurations, such as for PCB use.

In one embodiment, the adjustment mechanism is designed to position the adjustable border at a minimum in a position to cover a portion of the belt, to enable use of the conveyor with PCBs.

Some of the manual adjustment mechanism are illustrated. In one embodiment, as noted above, the adjustment mechanism is a screw and adjustment hole 410 which provides two positions. In another embodiment, the adjustment mechanism uses a screw and dual screw holes 420, in which the screws are moved between a first hole in a forward position and a second hole in the rearward position.

The adjustment mechanism may be bolts.

The adjustment mechanism may be magnet pairs 430 in two positions.

The adjustment mechanism may be pegs or dowels 440 which are inserted into holes. In one embodiment, there may be two holes, one for the forward (PCB position) and one for the rearward (pallet) position. In one embodiment, the border may be removable, so there is only a single hole configuration 445 for the dowel, or screw, or other type of fastener.

The adjustment mechanism may be clips, which clip the adjustable border in place in one of the two positions. The adjustment mechanism may be snap fasteners 450, consisting of a pair of interlocking elements. In one embodiment, for snap fasteners, or other fasteners that extend from the adjustable border, the adjustable border may include two snaps at the forward and rearward locations, and the belt conveyor's edge may include sunk-in areas for the additional snap such that the adjustable border is not elevated from the edge. In one embodiment, the border may be removable.

The attachment mechanism may be a sliding lock 460, in which the lock travels in a slotted hole, and locks in place with a turn of a knob. In one embodiment, in some configurations the border may not be removable once installed but may be repositionable without removal.

In one embodiment, the border may be hinged 470, so that the border is tilted, rotated, or swung from one position to the other.

Various of the described adjustment mechanisms may be automated, such that no human intervention is needed to adjust the adjustable border's position. For example, screws may be loosened and tightened automatically. A mechanical element may move the border between positions. Additionally, the adjustment mechanism may be a movable member on the edge 480, which is moved using electronic controls.

Other types of adjustment mechanisms may be used. In general, the adjustable border is designed to configure a belt conveyor from a pallet configuration to a PCB configuration.

Figure 5D:
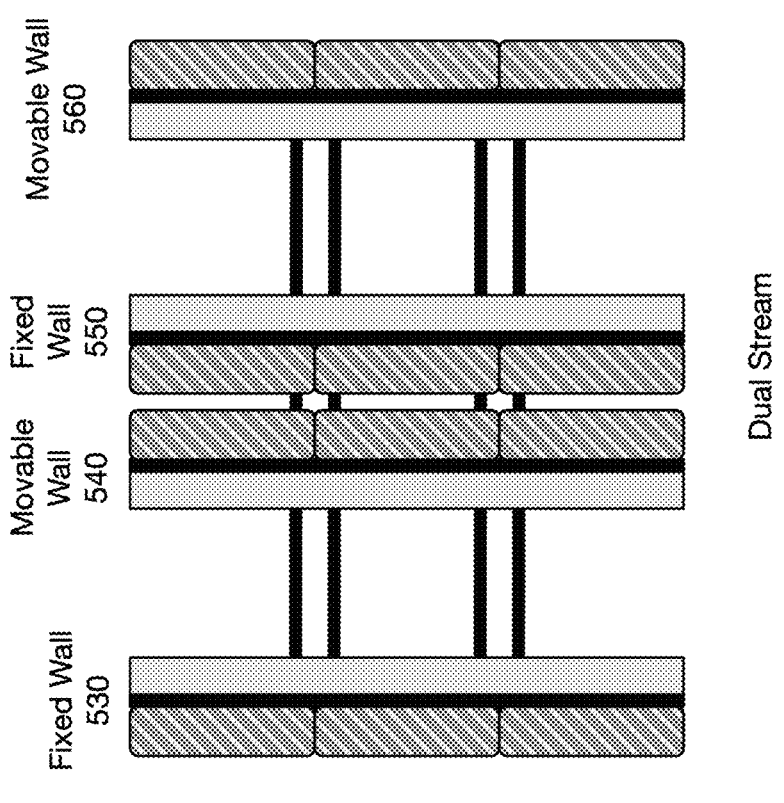

FIGS. 5A-5D are simplified diagrams of the conveyor belt showing the width adjustability, and the multi-stream adjustability. As can be seen in FIGS. 5A and 5B, the fixed wall 510 remains in place, while the movable wall 520 can be positioned anywhere along the width of the belt conveyor, anywhere between a narrowest and a widest configuration. The width of the belt conveyor is defined by the size of the workpiece.

Figure 5C:
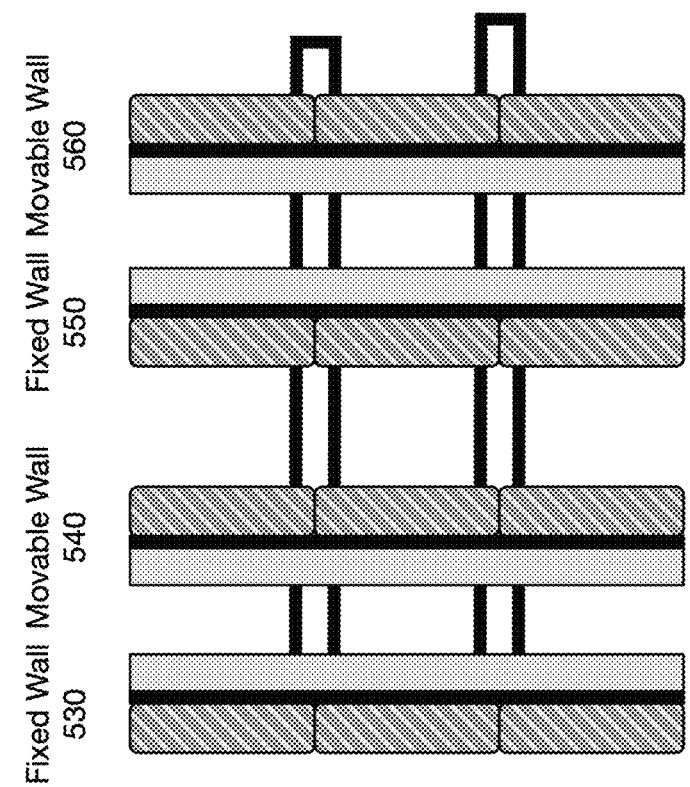

As shown in FIGS. 5C and 5D, the two fixed walls 530, 550 remain in place, while the adjustable walls 540, 560 may be positioned to change between narrower wider configurations. In one embodiment, at its widest, the movable wall 540 is positioned in close proximity to the second fixed wall, providing sufficient clearance for electronics and other protruding elements. In one embodiment the two streams are configured with the same width. In one embodiment, both of the movable walls 540, 560 are attached to the same ball screw(s) and thus have the same amount of movement when the screws are rotated. Moreover, both streams usually deal with the same size objects so there is no need to have different widths.

Figure 6:
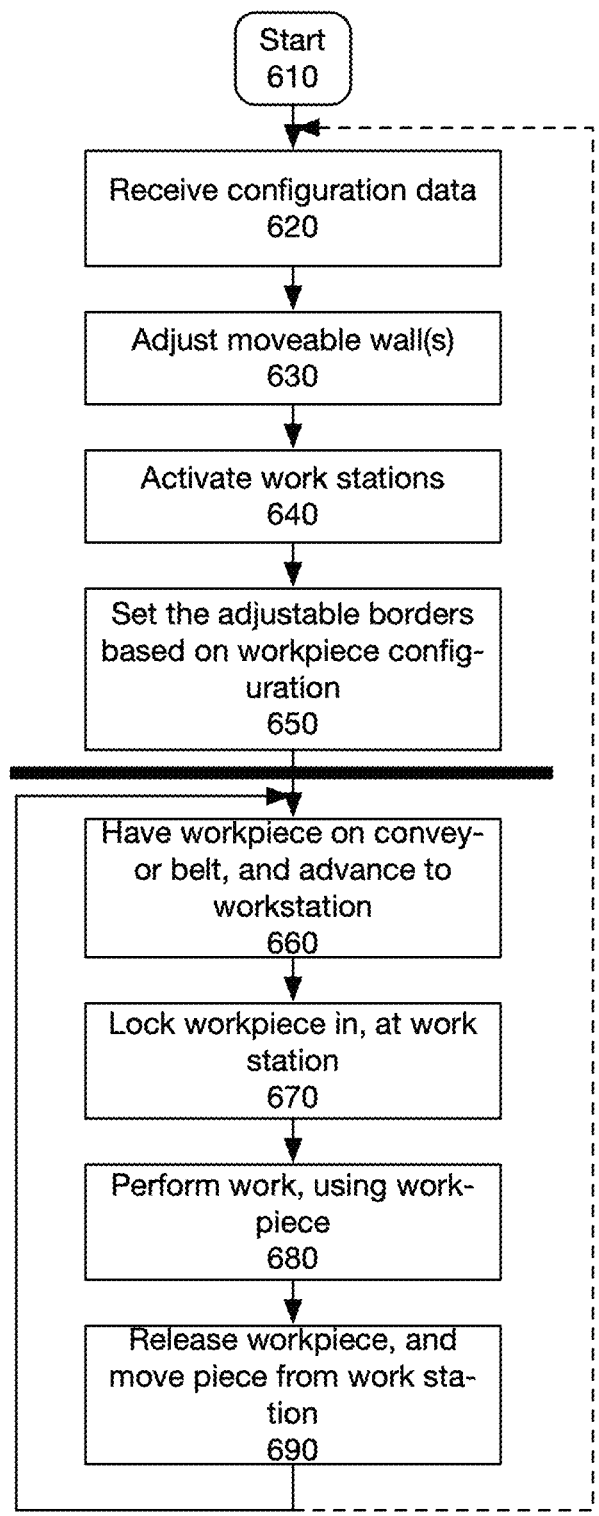
FIG. 6 is a flowchart of one embodiment of using the belt conveyor.

FIG. 6 is a flowchart of one embodiment of using the belt conveyor. The process starts at block 610.

At block 620, the configuration data is received. The configuration data specifies the number of streams, the type and width of the workpieces (pallets, PCBs, etc.) that will be conveyed, and the number of work stations.

At block 630, the movable wall(s) are adjusted to the appropriate distance. In one embodiment, this is done manually by a technician. In another embodiment, it may be done in an automated manner.

At block 640, in one embodiment, the appropriate work stations are activated. Each work station is a position at which the workpiece (pallet or PCB) may be fixed, while it is being used by the automated manufacturing systems.

At block 650, the adjustable border is adjusted to the workpiece size, based on the configuration data received. In one embodiment, this is done manually by a technician. In another embodiment, it may be done in an automated manner.

The configuration is then complete.

In use, the workpiece is placed on the conveyor belt. The conveyor belt advances to the work station, at block 660.

The workpiece is stopped at the work station. In one embodiment, the workpiece may be stopped by the conveyor belts stopping. In one embodiment, the workpiece may be stopped by using pop-up stoppers (not illustrated).

At block 670, in one embodiment the workpiece is locked into the work station. Locking in stabilizes the workpiece at the work station, so that robotic elements can interact with the workpiece. In one embodiment, for a pallet, the work station on the edges of the conveyor belt raise the pallet from the conveyor belt and lock it in place. In one embodiment, for a PCB, the work station on the edges of the conveyor belt stabilize the PCB. In one embodiment, for a PCB an additional stabilization element may be utilized.

At block 680, the work is done, using parts from or on the workpiece, as is known in the art.

At block 690, the workpiece is released from the work station. The conveyor belt then moves the workpiece from the working location. The conveyor belt may move the workpiece forward to another processing station. The system then returns to block 660, to advance the next workpiece to the work station. If reconfiguration is needed, the conveyor process stops, while the process restarts from block 620. In this way, the configurable conveyor can be adjusted to accommodate workpieces of various sizes, as well as various types, including pallets or PCB boards of any size, using one or two streams.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

I claim:

1. A configurable belt conveyor for manufacturing comprising:
   a first belt and a second belt, moving in unison, forming a single stream conveyor;
   an adaptable border adjacent to the first belt and the second belt to define a width of the belt conveyor when the belt conveyor is moving, the adaptable border having a first configuration in which a first width of the first belt and the second belt is available for supporting a first type of workpiece, and a second configuration in which a second width of the first belt and the second belt are covered by the adaptable border, such that the second width of the first belt and the second belt are sized for supporting a second type of workpiece.

2. The configurable belt conveyor of claim 1, wherein the first type of workpiece is a pallet, and the second type of workpiece is a printed circuit board (PCB).

3. The configurable belt conveyor of claim 1, wherein the adaptable border comprises an anti-static low-friction material movably coupled to an edge of the conveyor belt structure.

4. The configurable belt conveyor of claim 1, wherein the adaptable border is attached using one or more elongated screw holes, such that when one or more screws fixing the adaptable border in the first configuration are loosened, the adaptable border may be slid to be in the second configuration, and vice versa, before tightening the one or more screws.

5. The configurable belt conveyor of claim 1, wherein the adaptable border is attached using a magnetic positioner.

6. The configurable belt conveyor of claim 1, wherein the adaptable border is attached using a snap fitting.

7. The configurable belt conveyor of claim 1, further comprising:
   an automated shifting device to shift the adaptable border automatically between the first configuration and the second configuration.

8. The configurable belt conveyor of claim 1, further comprising:
   a positioning work station attached to the configurable belt conveyor, the positioning work station to fix a pallet in a position during an operation.

9. The configurable belt conveyor of claim 8, wherein the positioning work station can be attached in a plurality of positions along the configurable belt conveyor.

10. The configurable belt conveyor of claim 9, wherein the configurable belt conveyor may include a plurality of positioning work stations.

11. The configurable belt conveyor of claim 1, further comprising:
    wherein the first belt is on a fixed wall, and the second belt is on a moveable wall, such that a width of the belt conveyor is adjustable; and
    a pair of ball screws to adjust the width of the belt conveyor, wherein the pair of ball screws provide movement for the moveable wall and guide the moveable wall.

12. The configurable belt conveyor of claim 1, further comprising:
    wherein the belt conveyor is a self-tracking timing belt to move the first belt and the second belt; and
    a clear space between the first belt and the second belt to enable dual-sided printed circuit boards (PCBs) on the belt conveyor.

13. A configurable belt conveyor for manufacturing comprising:
    a belt;
    an adaptable border adjacent to the belt, the adaptable border having a first configuration in which a first width of the belt is available for supporting a first type of workpiece, and a second configuration in which a portion of the belt is covered by the adaptable border, such that a second width of the belt is sized for supporting a second type of workpiece.

14. The configurable belt conveyor of claim 13, wherein the first type of workpiece is a pallet, and the second type of workpiece is a printed circuit board (PCB).

15. The configurable belt conveyor of claim 13, wherein the adaptable border comprises an anti-static low-friction material movably coupled to an edge of the conveyor belt structure.

16. The configurable belt conveyor of claim 13, wherein the adaptable border is attached using one of:
    one or more elongated screw holes, such that when one or more screws fixing the adaptable border in the first configuration are loosened, the adaptable border may be slid to be in the second configuration, and vice versa, before tightening the one or more screws, one or more magnetic positioners, or one or more snap fittings.

17. The configurable belt conveyor of claim 13, further comprising:
    an automated shifting device to shift the adaptable border automatically between the first configuration and the second configuration.

18. The configurable belt conveyor of claim 13, further comprising:
    one or more positioning work stations attached to the configurable belt conveyor, the one or more positioning work stations to fix one or more pallets in one or more positions during an operation;

wherein each positioning work station can be attached in a plurality of positions along the configurable belt conveyor.

19. The configurable belt conveyor of claim 13, comprising:

a second belt in parallel with the belt;

wherein the belt is on a fixed wall, and the second belt is on a moveable wall, such that a width of the belt conveyor is adjustable; and a pair of ball screws to adjust the width of the belt conveyor, wherein the pair of ball screws provide movement for the moveable wall and guide the moveable wall.

20. The configurable belt conveyor of claim 19, further comprising:

wherein the belt is a self-tracking timing belt to move the belt and the second belt; and a clear space between the belt and the second belt to enable dual-sided printed circuit boards (PCBs) on the belt conveyor.

\* \* \* \* \*